United States Patent
Motz et al.

(10) Patent No.: US 7,492,149 B2
(45) Date of Patent: Feb. 17, 2009

(54) CIRCUIT CONFIGURATION FOR PROCESSING A SIGNAL OF A SENSOR AND METHOD OF USING THE CIRCUIT CONFIGURATION

(75) Inventors: Mario Motz, Wernberg (AT); Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 888 days.

(21) Appl. No.: 10/446,392

(22) Filed: May 28, 2003

(65) Prior Publication Data
US 2003/0225539 A1 Dec. 4, 2003

(30) Foreign Application Priority Data
May 28, 2002 (DE) ................. 102 23 767

(51) Int. Cl.
*G01B 7/30* (2006.01)
(52) U.S. Cl. .................. 324/207.2; 324/207.12; 324/207.25
(58) Field of Classification Search ........... 324/207.2, 324/251, 207.12, 207.25, 173, 174, 179; 338/32 H
See application file for complete search history.

(56) References Cited

U.S. PATENT DOCUMENTS 6,124,713 A * 9/2000 Bornhofft et al. ........... 324/345
6,320,430 B1 11/2001 Blossfeld
6,532,436 B2 3/2003 Motz
6,674,322 B2 * 1/2004 Motz ........................... 330/9

FOREIGN PATENT DOCUMENTS

| DE | 199 64 002 A1 | 7/2001 |
|---|---|---|
| DE | 100 32 530 A1 | 1/2002 |
| DE | 100 62 292 A1 | 3/2002 |
| WO | 01/22037 A1 | 3/2001 |

OTHER PUBLICATIONS

English Translation of DE 100 32 530 A1, 23 pages, Aug. 2007.*

* cited by examiner

*Primary Examiner*—Patrick J Assouad
*Assistant Examiner*—David M. Schindler
(74) *Attorney, Agent, or Firm*—Laurence A. Greenberg; Werner H. Stemer; Ralph E. Locher

(57) ABSTRACT

A circuit configuration for processing a signal of a sensor includes an amplifier for amplifying the signal of the sensor. This signal has switch-over points between different signal states. The circuit configuration is constructed in such a manner that the amplifier and the sensor operate continuously in a chopper mode. Furthermore, a control loop is provided for determining offset components in the signal of the sensor and for removing the offset components from the signal of the sensor.

16 Claims, 2 Drawing Sheets

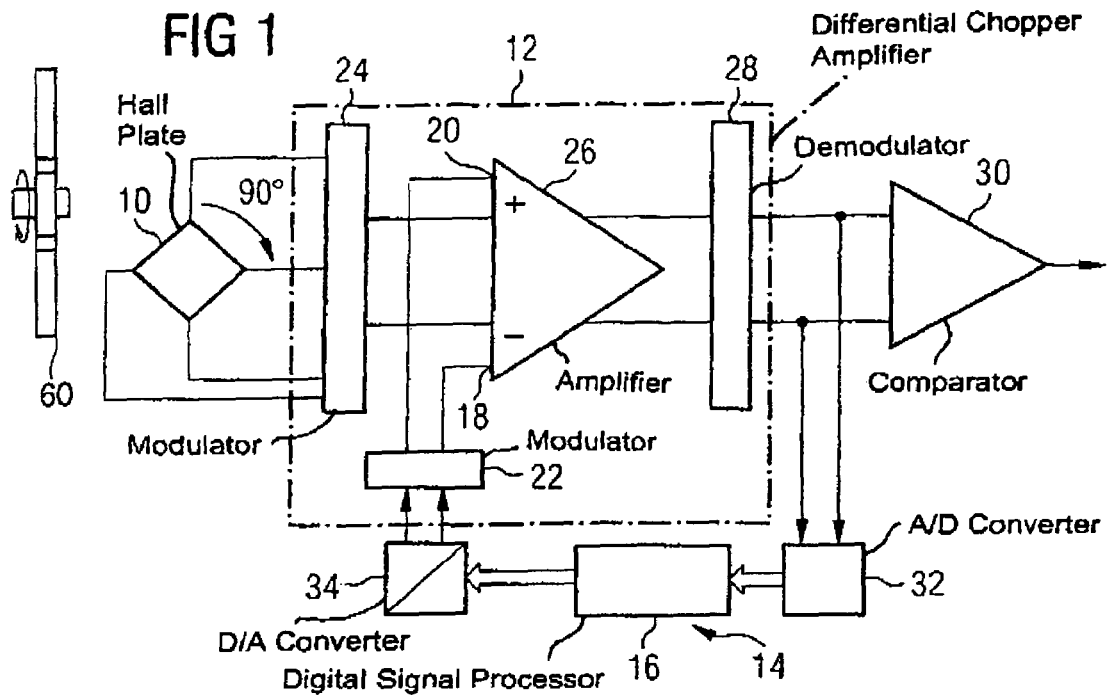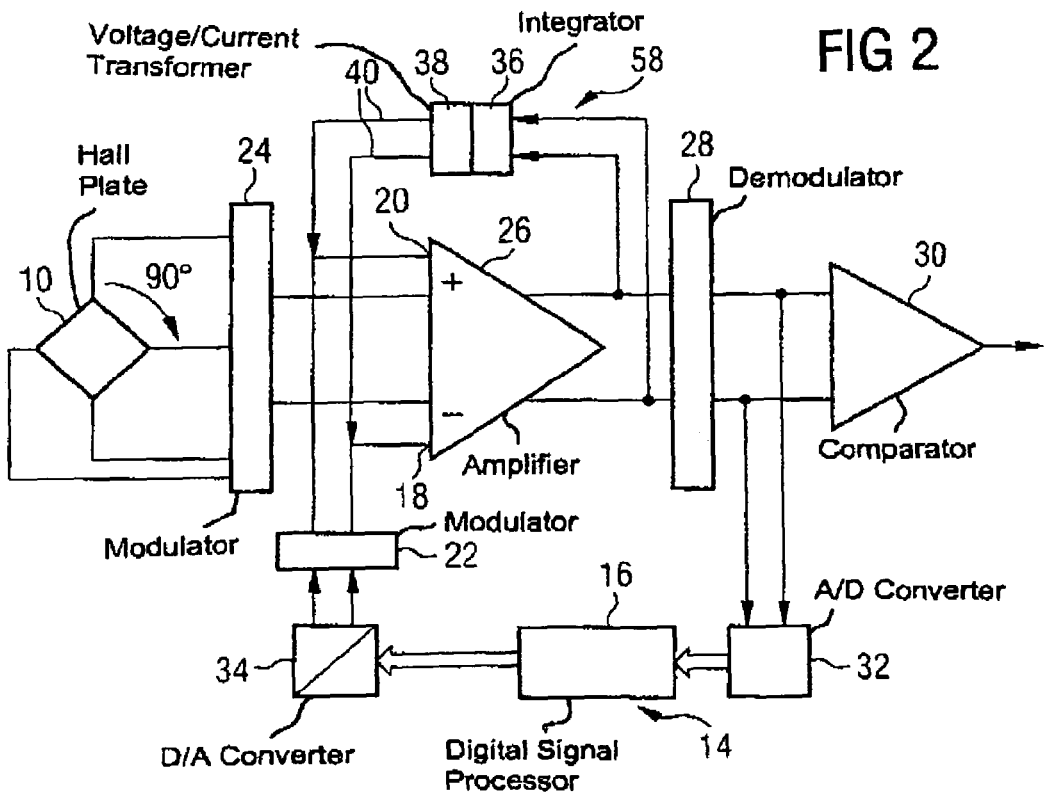

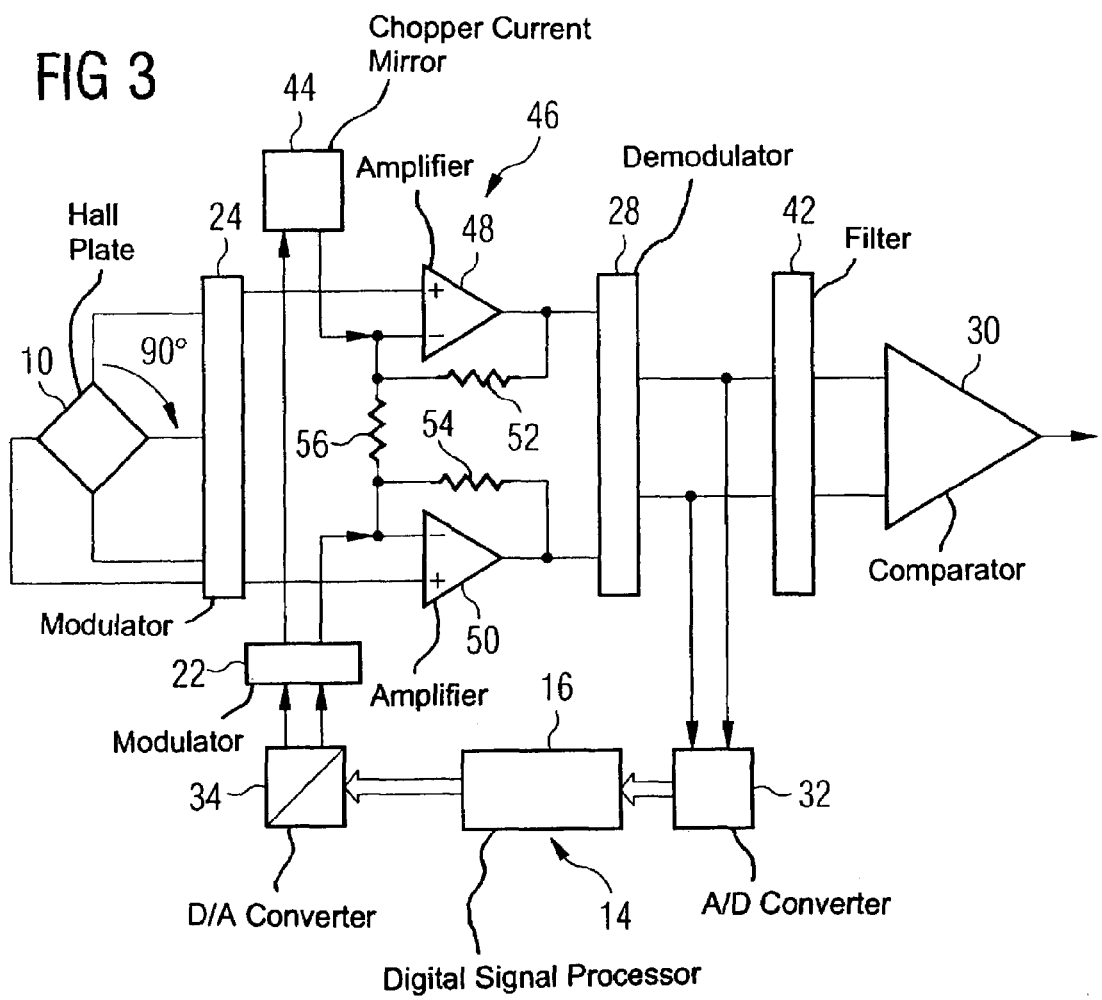

CIRCUIT CONFIGURATION FOR PROCESSING A SIGNAL OF A SENSOR AND METHOD OF USING THE CIRCUIT CONFIGURATION

BACKGROUND OF THE INVENTION

Field of the Invention

The invention relates to a circuit configuration for processing a signal of a sensor and to a method of using the circuit configuration.

In many sensors that deliver an electrical signal, the accuracy of the measuring process is impaired by offset components in the sensor signal. Although it is possible to largely eliminate offset components or signal components by using closed-loop control systems during the measuring or sensor operation, a certain time is required after a sensor system has been taken into operation until the control system acts and the measurement signal relatively accurately reproduces the quantity to be measured. In many sensor systems, in particular, it is not possible at all to obtain an accurate measurement signal immediately after they have been switched on or taken into operation, respectively.

In sensor systems for detecting the position of mechanical elements, such as, for example, a Hall sensor for camshaft configurations, however, it is especially important, after the operating voltage has been switched on, to detect the position of a mechanical element which, in particular, is idle, in order to achieve accurate measurements. In the case of a Hall sensor for camshaft configurations, for example, the position of a twist wheel of a camshaft should be detected as accurately as possible after the operating voltage has been switched on, i.e. whether it is a tooth gap or a tooth of the toothed wheel which is facing the sensor. This is required, in particular, for correctly controlling electromechanical injection valves and for particular emergency running properties in the case of which the Hall sensor supplies not only camshaft information, but also ignition information. Furthermore, the signal generated by the Hall sensor during the running operation should exhibit high phase accuracy in the detection of the tooth flanks in the case of camshaft sensors. In other words, switch-over points between different states of a sensor signal should reproduce the transitions from a tooth to a tooth gap of a rotating toothed wheel with the best possible angular accuracy.

As a rule, however, no information, for example, about the maximum, the minimum and the mean value of the sensor signal, is yet available for determining these switch-over points after the operating voltage has been switched on. Although it is possible to generate an accurate sensor signal using a control loop with minimum and maximum detection and averaging, particularly by eliminating interfering offset components, the sensor system must have already been operating for a particular period for this purpose in order to have sufficient information about the variation of the sensor signal for the evaluation.

Storing information for offset compensation in the sensor system is frequently found to not be a suitable method since the information is essentially influenced by unstable mechanical stress voltages of the sensor which change in dependence on various parameters such as, for example, the temperature, and therefore fluctuate. However, such fluctuating influences and the resultant offset components can be compensated for by applying chopper principles. In the field of Hall sensors, chopper principles are also known by the terms spinning Hall, switched-, active-offset compensation or connector-commutated Hall plate.

In particular, the chopper principles provide for a so-called TPO (True Power On) function of the sensor. A TPO function is understood to be the precise measuring operation immediately after the operating voltage of a sensor system has been switched on, which is of importance, for example, for the precise detection of the position of an idle mechanical element such as a toothed wheel. Chopper principles are suitable for a TPO function since they make it possible essentially to eliminate offset components, which impair the measuring accuracy, from the sensor signal immediately after the operating voltage of a sensor system has been switched on.

However, the chopper principles produce a delay time in the sensor signal which entails a phase error which is speed-dependent, for example in the case of a toothed-wheel sensor. The delay time is produced by the fact that normally at least two phases of the sensor signal which follow one another in time must be sampled, added or filtered in order to be able to eliminate the offset components. In the case of a camshaft sensor, this results in a speed-dependent phase error of $d\_Phi = \leq\_ * f * 360°$. Here, $\leq\_$ is the filtering time or the time necessary for averaging at least two successive phases for offset compensation of the sensor signal, f is the rotational frequency of the rotating toothed wheel of the camshaft sensor and $d\_Phi$ is the speed-dependent phase error resulting from the delay time.

To solve these problems, static differential sensors in conjunction with complementary toothed wheels are known, for example, in the field of Hall sensors. An example of such a differential sensor is the differential Hall effect sensor HAL320 from Micronas GmbH. The sensor is operated in accordance with a chopper principle that is implemented by sampling techniques. A so-called back bias field is superimposed on the sensor in order to eliminate influences due to offset components from the sensor signal. However, the sensor only supplies a discrete-time output signal that generates a large phase error and jitter at high speeds of the toothed wheel. Furthermore, the sensor requires a complementary toothed wheel, the structure of which is more complicated than conventional toothed wheels and also requires the sensor to be installed in particular directions.

From International Publication WO 01/22037, it is known to switch from a chopped amplifier to an unchopped amplifier in a Hall sensor system. The chopped amplifier is used for implementing a TPO function. The unchopped amplifier, in conjunction with a so-called switching point control loop, is used to accurately provide a phased switching of the output signal of the sensor. This switching can be done with little delay since the filters or phase addition stages, otherwise needed for the chopping, are not needed in the conventional operation of the sensor, that is to say long after the operating voltage has been switched on. During the switching between the amplifiers, however, phase discontinuities occur in the output signal of the sensor system since the signal delays in the amplifiers are optimized. In addition, integrating the sensor on a chip requires a large area. Due to the multiplicity of electronic components, this circuit also exhibits high power consumption. Furthermore, the unchopped amplifier cannot be fully modulated since offset components and TPO signals become superimposed, at least after the operating voltage has been switched on.

Furthermore, it is known from U.S. Pat. No. 6,532,436 (Motz) to switch between a chopped mode and an unchopped mode of a Hall plate as a sensor and of an amplifier or comparator. However, signal discontinuities can occur when switching back to chopper mode since, in the meantime, the offset components may have drifted thermally. In addition, flicker noise can occur in the unchopped mode. Furthermore, elaborate devices are required for switching between the two operating modes in order to prevent any phase discontinuities due to different signal transit times.

SUMMARY OF THE INVENTION

It is accordingly an object of the invention to provide a circuit configuration for processing a signal of a sensor which overcomes the above-mentioned disadvantages of the prior art apparatus of this general type.

In particular, it is an object of the invention to provide a circuit configuration for processing a signal of a sensor which distinctly reduces or completely prevents the problems mentioned initially.

With the foregoing and other objects in view there is provided, in accordance with the invention, a circuit configuration including: a sensor for providing a signal having switch-over points between different signal states; an amplifier for amplifying the signal of the sensor; and a control loop for determining offset components in the signal of the sensor and for removing the offset components from the signal of the sensor. The amplifier and the sensor are configured for operating continuously in a chopper mode.

To prevent problems such as phase discontinuities or signal discontinuities in the output signal of the circuit configuration, a sensor and an amplifier for amplifying a signal of the sensor are operated continuously in a chopper mode. This makes it possible to suppress offset components in the signal of the sensor and any drift in the sensor and/or amplifier during the entire operation of the circuit configuration including the sensor and amplifier. Furthermore, a control loop is provided in order to determine offset components in the signal of the sensor and to remove them from the signal of the sensor.

In a preferred embodiment of the control loop, it is also possible to adjust switch-over points between different signal states of the signal of the sensor. Any phase offset contained in the signal of the sensor can be reduced or even eliminated by adjusting the switch-over points using the control system. As a result, an output signal of the circuit configuration reproduces the measurement quantity of the sensor in a relatively accurately phased manner.

In particular, the control loop is designed for detecting a minimum/maximum of the signal of the sensor. The control loop preferably determines minimum and maximum values of the signal of the sensor and evaluates them for adjusting the switch-over points. For example, using the minimum and maximum values, it can determine mean values of the signal of the sensor by way of which switch-over points can be adjusted.

The control loop preferably includes a digital section by way of which the signal of the sensor is analyzed and processed in accordance with a predetermined algorithm. In contrast to a purely analog control loop, a digital section can analyze and process, in particular evaluate, the signal of the sensor more precisely.

The digital section is preferably designed in such a manner that it switches between a TPO mode and a calibration mode. Using digital technology, this can be performed essentially without influencing the output signal of the circuit configuration, whereas, in the case of analog technology, the switch-over can influence the output signal in the form of signal and/or phase discontinuities.

In this configuration, a calibration mode is understood to be, in particular, a mode in which the switch-over points of the signal of the sensor are adjusted. If, for example, the circuit configuration according to the invention is used in a sensor system with Hall sensors for detecting teeth and tooth gaps of a toothed wheel, the TPO mode is used for accurately detecting the position of the toothed wheel immediately after an operating voltage has been switched on, and with an idle toothed wheel. The calibration mode is preferably used for adjusting the accurately phased mapping of the tooth flanks in the output signal of the circuit configuration when the toothed wheel is rotating.

In a preferred, particularly power-saving embodiment of the circuit configuration, the control loop operates during the calibration mode and, after the calibration mode is concluded, it is switched off or the control rate, the control increment or the control range is changed.

A signal, which is generated by the control loop, for adjusting the switch-over points of the signal of the sensor can be fed into an input of the amplifier provided for this purpose. Feeding-in the signal for adjusting the switch-over points makes it possible to keep the modulation signal low at the output of the amplifier. As a result, offset components and TPO signals are already compensated for at the input of the amplifier and thus do not lead to any additional modulation at the output of the amplifier. As a result, the signal gain of the amplifier can be selected to be large. Offset components of subsequent signal processing stages will then only have an effect inasmuch as they are suppressed by the high gain.

In a particularly preferred embodiment, the control loop includes an analog/digital converter that is followed by a digital signal processor. The digital signal processor, in turn, is followed by a digital/analog converter that feeds the signal for adjusting the switch-over points into the input of the amplifier. In this configuration, the digital signal processor performs a program for analyzing and processing the signal of the sensor. In contrast to analog signal processing, such digital signal processing is less susceptible to interference and, as a rule, is more accurate.

In a preferred development, this control loop, particularly the digital signal processor, for example, by using a program, provides a signal for adjusting the switch-over points of the signal of the sensor by detecting a minimum/maximum of the signal of the sensor. An advantage of the digital signal processing of the control loop consists, in particular, in that very low input frequencies are possible since the signal for adjusting the switch-over points, due to the digital signal processing, responds to edges instead of frequencies as in the case of analog signal processing.

To achieve high suppression of interference due to common mode interference, the sensor signals are preferably processed in differential technology. For this purpose, the circuit configuration is preferably constructed in differential technology.

In a further preferred embodiment, a digital/analog converter having two outputs can be provided in the control loop. A first output of the digital/analog converter can be connected to a current mirror, the output of which is connected to an input of the amplifier. A second output of the digital/analog converter is then connected directly to an input of the amplifier. As a result, balanced modulation can be achieved with differential technology which, in turn, provides for a larger modulation range and higher accuracy.

Furthermore, the amplifier can be a chopper amplifier with error feedback as is known from Published German Patent Application DE 100 32 530 A1. Such an amplifier has a short delay time since the chopped signal only needs to be filtered slightly. The filter group delay can be selected to be so small that it is only necessary to set a multiple of the chopper frequency as a cut-off frequency of a filter in the circuit configuration.

In a preferred embodiment, the amplifier can also be an electrometer amplifier that has inverting inputs for supplying the signal for controlling the switch-over points. Such an amplifier saves surface area and is thus ideally suited to integrating the circuit configuration on a semiconductor chip. In this configuration, taps on feedback resistors of the electrometer amplifier can form the additional input of the amplifier. This method also saves surface area and enables the configuration to be matched to currents of a digital/analog converter which are fed into the amplifier for compensating for interference signals. As an alternative, taps on the collector resistors of a bipolar differential stage can form the additional input for the signal for controlling the switch-over points of the amplifier. Finally, in a further alternative, the inputs and outputs of feedback-type OTAs (Operational Transconductance Amplifiers) of a Gm/Gm amplifier can form the additional input for controlling the switch-over points of the amplifier.

A further advantage of the invention consists in suppressing flicker noise of the amplifier due to the continuous chopper operation. As a result, the input transistors of the amplifier can be constructed to be small in area which, in particular, has advantages when the circuit configuration is integrated on a semiconductor chip.

By feeding the signal for adjusting the switch-over points into an additional input of the amplifier, it only needs to be able to modulate an error signal and a useful signal at its output, but not a TPO signal. If, furthermore, error signal feedback is used in the amplifier, it is only necessary to be able to modulate the useful signal at the amplifier output. Overall, continuous chopper operation avoids having to integrate elaborate switch-over and matching circuits that have large areas on a semiconductor chip.

The circuit configuration according to the invention is preferably used in a sensor system with Hall sensors for detecting the position of a toothed wheel.

Other features which are considered as characteristic for the invention are set forth in the appended claims.

Although the invention is illustrated and described herein as embodied in a circuit configuration for processing a signal of a sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a first exemplary embodiment of a circuit configuration implemented for processing signals of a sensor;

FIG. 2 is a block diagram of a second exemplary embodiment of the circuit configuration for processing signals of a sensor, in which the chopper amplifier includes an error feedback loop; and FIG. 3 is a block diagram of a third exemplary embodiment of the circuit configuration for processing signals of a sensor, in which the chopper amplifier is constructed as an electrometer amplifier.

DESCRIPTION OF THE PREFERRED EMBODIMENTS

In the text that follows, identical and functionally identical elements have been provided with the same reference symbols.

Referring now to the figures of the drawing in detail and first, particularly, to FIG. 1 thereof, there is shown a measuring circuit for measuring magnetic fields. The measuring circuit includes a Hall plate 10 as a sensor, a differential chopper amplifier 12 following the Hall plate 10, a comparator 30 following the chopper amplifier 12 and a (differential) control loop 14 of the chopper amplifier 12.

The Hall plate 10 has four terminals. An excitation current for the Hall plate 10 is impressed into two opposite terminals. At the other two opposite terminals, the Hall voltage is picked up. The Hall plate 10 is operated in accordance with the spinning Hall principle as shown by the arrow. According to this principle, the connections of the Hall plate are cyclically exchanged at a predetermined clock rate, i.e. the excitation current is impressed at a first pair of terminals during one clock period and at a second pair of terminals, arranged at an angle of about 90° with respect to the first pair of terminals, in a subsequent clock period. The connections for picking up the Hall voltage are correspondingly exchanged. Offset components in the signal of the Hall plate 10, particularly alternating-voltage error signals, can be reduced, in particular, by adding the Hall voltages picked up in successive clock periods.

The Hall plate 10 is used for measuring the rotation of a toothed wheel 60, which is part of a camshaft sensor. The important factor is, in particular, that the output signal of the comparator 30 reproduces the movement of the toothed wheel in an accurately phased manner. In other words, signal edges or transitions between different signal states in the output signal of the comparator 30 should reproduce a transition from a tooth to a tooth gap of the toothed wheel or conversely as accurately timed as possible.

The Hall plate 10 is connected to a first modulator 24 of the chopper amplifier 12. The first modulator 24 is used for rotating the connections of the Hall plate 10 in accordance with the spinning Hall principle. For this purpose, the first modulator 24 is operated with a chopper cycle. The chopper cycle determines the frequency with which the connections of the Hall plate 10 are exchanged. The first modulator 24 is constructed as a change-over switch.

The output signals of the first modulator 24 which exhibit both useful signals of the Hall plate 10 and offset components are supplied to the input of an amplifier 26 of the chopper amplifier 12. The signals supplied are amplified by the amplifier 26 and supplied to a demodulator 28 following the chopper amplifier 12. The demodulator 28 demodulates the supplied signals in accordance with the spinning Hall principle and supplies the signals demodulated in this way to the comparator 30 and to the control loop 14. For this purpose, the demodulator 28, which similarly to the first modulator 24, is a change-over switch, is also operated with the chopper timing.

The control loop 14 has an analog/digital converter 32 which converts the signals supplied by the demodulator 28 into digital signals and supplies them to a digital signal processor 16 of the control loop 14. The digital signal processor 16 determines the optimum switch-over points in the signal of the sensor 10 from the supplied digitized signal by way of a minimum/maximum detection. Due to the digital signal processing in the control loop 14, low input frequencies are sufficient since this is in response to a signal edge instead of frequencies as in the case of analog signal processing.

From determined switch-over points, the digital signal processor 16 generates a signal for adjusting the switch-over points and this signal is supplied to a digital/analog converter 34 that converts it into an analog signal. The analog signal is supplied by the digital/analog converter 34 to a second modulator 22 that is operated with the chopper timing. It therefore modulates the supplied signal for adjusting the switch-over points in accordance with the spinning Hall principle with which the Hall plate 10 is operated, and supplies it to special amplifier inputs for control loop signals 18 and 20 of the amplifier 26 so that the unwanted signal components contained in the signal of the Hall plate 10, particularly the offset components, are reduced.

The chopper amplifier 12 typically exchanges its inputs and outputs with respect to the useful signal at a high clock frequency, for example, of a few 100 kHz. The entire circuit configuration shown in FIG. 1 is operated exclusively in chopper mode. The offset signal component in the output signal of the Hall plate 10 is digitally determined by the digital signal processor 16, as a result of which, a precise measurement signal is obtained.

The continuous chopper operation enables offset components in the signal of the Hall plate 10 to be eliminated. This, in turn, provides for a TPO function. In normal measuring operation, the control loop 14 can be switched off or the control rate can be reduced as a result of which power can be saved and interference due to the control system is reduced. The switching-on preferably occurs after the control loop 14 has removed the offset components from the signal of the Hall plate 10 and the switch-over points in the signal of the Hall plate 10 have been adjusted precisely so that the output signal of the comparator 30 is a correctly phased image of the rotation of the toothed wheel, not shown. The switch-over points are preferably adjusted during a calibration mode.

FIG. 2 essentially shows the measuring circuit shown in FIG. 1, with the difference that the amplifier 26 additionally exhibits an error feedback 58 via which the interfering offset signals both of the Hall plate 10 and of the amplifier 26 are eliminated by integration. The error feedback includes an integrator 36 for integrating the output signal of the amplifier 26. The integrator 36 is followed by a voltage/current transformer 38 that converts the output voltage of the integrator 36 into a current that is supplied as an error signal 40 to the amplifier inputs 18 and 20 of the amplifier 26 for further offset compensation.

In the measuring circuit shown in FIG. 3, an electrometer amplifier 46 is used instead of a normal amplifier. Furthermore, a chopper current mirror 44 is provided in order to convert a first output signal of the second modulator 22 into a precise current which is fed into the electrometer amplifier 46. The second output signal of the second modulator 22 is directly fed into inputs of the electrometer amplifier 46 provided for this purpose. Both the first and the second output signal are fed in via a sensing resistor 56 which connects the two inverting inputs of a first and second amplifier 48 and 50, respectively, of the electrometer amplifier 46. The two amplifiers 48 and 50 are in each case fed back via a feedback resistor 52 and 54, respectively. The two amplifiers 48 and 50 are high-precision operational amplifiers with low temperature drift, low noise and high common-mode suppression and low input currents. In the measuring circuit shown in FIG. 3, furthermore, the comparator 30 is preceded by an output filter 42 which filters unwanted signal components out of the output signal of the entire circuit configuration, particularly spikes, which may occur as a result of the chopper operation.

We claim:

1. A circuit configuration, comprising:
    a sensor for providing a signal having switch-over points between different signal states;
    an amplifier for amplifying the signal of said sensor;
    a control loop for determining offset components in the signal of said sensor and for removing the offset components from the signal of said sensor;
    said amplifier and said sensor configured for operating continuously in a chopper mode; and
    said control loop being designed for determining and adjusting the switch-over points of the signal of said sensor while said sensor and said amplifier are operating continuously in the chopper mode.

2. The circuit configuration according to claim 1, wherein said control loop is designed for detecting one of a minimum and a maximum of the signal of said sensor.

3. The circuit configuration according to claim 1, wherein said control loop includes a digital section for analyzing the signal of said sensor and for processing the signal of said sensor in accordance with a predetermined algorithm.

4. The circuit configuration according to claim 3, wherein said digital section enables switching between a TPO mode and a calibration mode.

5. The circuit configuration according to claim 4, wherein in the calibration mode, the switch-over points of the signal of said sensor are adjusted.

6. The circuit configuration according to claim 5, wherein:
    said control loop is constructed to operate during the calibration mode; and
    said control loop is constructed such that after the calibration mode is concluded, said control loop is switched off, a control rate is changed, a control increment is changed or a control range is changed.

7. The circuit configuration according to claim 4, wherein:
    said control loop is constructed to operate during the calibration mode; and
    said control loop is constructed such that after the calibration mode is concluded, said control loop is switched off, a control rate is changed, a control increment is changed, or a control range is changed.

8. The circuit configuration according to claim 1, wherein said amplifier has an input for feeding-in a signal for adjusting the switch-over points of the signal of said sensor.

9. The circuit configuration according to claim 1, wherein:
    said control loop includes an analog/digital converter, a digital signal processor and a digital/analog converter; and
    said digital signal processor performing a program for analyzing and processing the signal of said sensor.

10. The circuit configuration according to claim 9, wherein said digital signal processor is designed for providing a signal for adjusting the switch-over points of the signal of said sensor by detecting one of a minimum and a maximum of the signal of said sensor.

11. The circuit configuration according to claim 1, wherein the circuit configuration is constructed in differential amplification circuitry.

12. The circuit configuration according to claim 1, wherein said amplifier is a differential amplifier.

13. The circuit configuration according to claim 1, further comprising:
    a current mirror having an output;

said control loop including a digital/analog converter having a first output and a second output;

said first output of said digital/analog converter connected to said current mirror;

said amplifier having a first input and a second input;

said output of said current mirror connected to said first input of said amplifier; and said second output of said digital/analog converter connected to said second input of said amplifier.

14. The circuit configuration according to claim 1, wherein said amplifier is a chopper amplifier with error feedback.

15. The circuit configuration according to claim 1, wherein said amplifier is an electrometer amplifier having inverting inputs for receiving a signal for adjusting the switch-over points of the signal of said sensor.

16. A method of using a circuit configuration, which comprises:

providing a circuit configuration including: a Hall sensor for providing a signal having switch-over points between different signal states, an amplifier for amplifying the signal of the sensor, and a control loop for determining offset components in the signal of the sensor and for removing the offset components from the signal of the sensor and for determining and adjusting the switch-over points of the signal of the sensor, the amplifier and the sensor configured for operating continuously in a chopper mode, the control loop determining and adjusting the switch-over points of the signal of the sensor while the amplifier and sensor are operating continuously in the chopper mode; and using the circuit configuration in a sensor system for detecting a position of a toothed wheel.

* * * * *